United States Patent
Ballweber et al.

(10) Patent No.: US 7,382,676 B2
(45) Date of Patent: Jun. 3, 2008

(54) METHOD OF FORMING A PROGRAMMABLE VOLTAGE REGULATOR AND STRUCTURE THEREFOR

(75) Inventors: Brian M. Ballweber, Austin, TX (US); David F. Moeller, Buda, TX (US); Stephen W. Dow, Austin, TX (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 170 days.

(21) Appl. No.: 11/474,473

(22) Filed: Jun. 26, 2006

(65) Prior Publication Data

US 2007/0297235 A1    Dec. 27, 2007

(51) Int. Cl.
*G11C 7/00* (2006.01)

(52) U.S. Cl. .................................. 365/226; 365/227

(58) Field of Classification Search ................ 365/226, 365/227, 228; 323/284; 713/321
See application file for complete search history.

(56) References Cited

U.S. PATENT DOCUMENTS

| 6,772,356 B1* | 8/2004 | Qureshi et al. ............. 713/321 |
| 2004/0128565 A1* | 7/2004 | Horigan ..................... 713/300 |
| 2006/0171230 A1* | 8/2006 | Bacchus et al. ............ 365/226 |

\* cited by examiner

*Primary Examiner*—Vu A Le
(74) *Attorney, Agent, or Firm*—Robert F. Hightower (57) ABSTRACT

In one embodiment, a programmable voltage regulator stores data representing a programmable configuration of the regulator. The regulator is configured to verify the validity of the stored data before using it to control the operation of the programmable voltage regulator.

20 Claims, 5 Drawing Sheets

| Bit No. | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| Function | D1 | D2 | D3 | D4 | D5 | D6 | D7 | P1 | D8 | D9 | D10 | D11 | D12 | D13 | D14 | P2 | D15 | D16 | D17 | D18 | D19 | D20 | E1 | P3 | E2 | E3 | E4 | E5 | E6 | E7 | E8 | P4 |

Program Data Word

METHOD OF FORMING A PROGRAMMABLE VOLTAGE REGULATOR AND STRUCTURE THEREFOR

CROSS-REFERENCE TO RELATED APPLICATIONS

This application is related to an application entitled "METHOD OF FORMING A FEEDBACK NETWORK AND STRUCTURE THEREFOR" having inventors Stephen Dow et al, Ser. No. 11/474,472,having some common inventors, a common assignee and filed concurrently herewith which is hereby incorporated herein by reference.

BACKGROUND OF THE INVENTION

The present invention relates, in general, to electronics, and more particularly, to methods of forming semiconductor devices and structure.

In the past, the semiconductor industry utilized various methods and structures to form semiconductor devices that had programmable functionality. In some cases, it was desirable to be able to program the functionality after the semiconductor device was assembled into a semiconductor package. The prior methods of programming functionality into a packaged semiconductor device generally required dedicating one or more pins or terminals of the package and the corresponding inputs of the semiconductor device to be used for the programming. Using package pins and semiconductor device inputs required that the semiconductor device and the package have additional inputs thereby increasing the cost of the programmable semiconductor device.

Additionally, once the functionality was programmed into the semiconductor device, it was possible that a malfunction could cause the programming information to be changed. As a result, the semiconductor device could operate with undesired functionality.

Accordingly, it is desirable to have a programmable semiconductor device that minimizes the number of pins utilized for programming the device, that minimizes the impact of changes in the programmed information, and that has a low cost.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action.

DETAILED DESCRIPTION OF THE DRAWINGS

Figure 1:
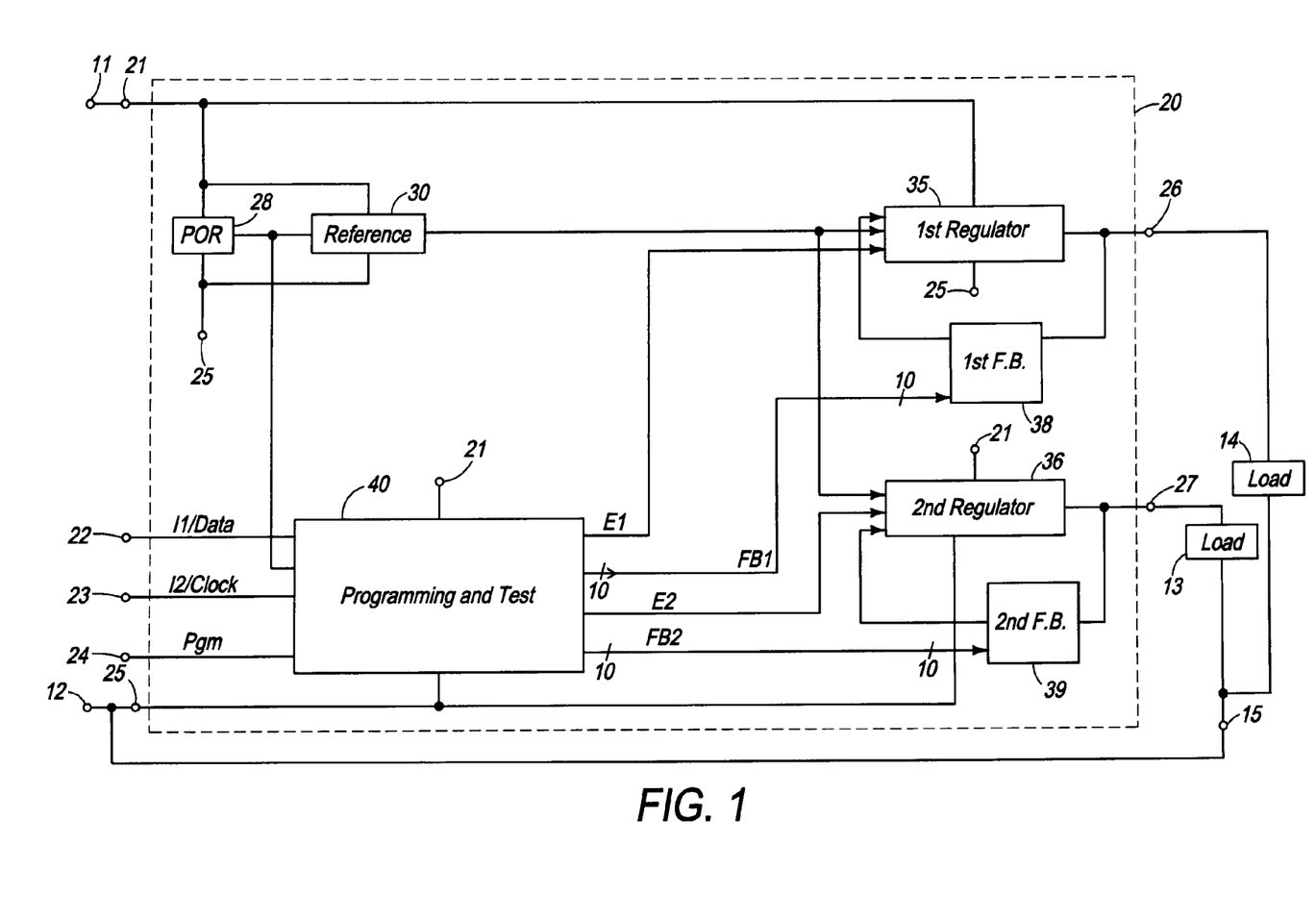
FIG. 1 schematically illustrates a block diagram of a portion of a system that includes a programmable voltage regulator in accordance with the present invention.

FIG. 1 schematically illustrates an embodiment of a portion of a system 10 that includes a programmable voltage regulator 20 utilized to supply regulated output voltages to a load 13 and a load 14. In the preferred embodiment, regulator 20 includes an output 26 and an output 27 that each supply independent regulated output voltages. As will be seen further hereinafter, the value of each of the output voltages is programmed by using data that is externally supplied to regulator 20. The externally supplied data is stored within regulator 20 and utilized to control the value of the output voltages. Regulator 20 receives the data on pins or inputs that are utilized for other functions during other operating modes of regulator 20. Regulator 20 also provides an error checking function that is used to determine the validity of the data or if the value of the data changes after the data is programmed into regulator 20.

System 10 generally receives power, such as a DC voltage, between a power input 11 and a power return 12. Loads 13 and 14 usually are connected between respective outputs 27 and 26 of regulator 20 and a load return 15 that generally is connected to return 12. Regulator 20 receives power between a voltage input 21 and a voltage return 25 that generally are connected to input 11 and return 12, respectively. Regulator 20 also includes a first signal input 22, a second signal input 23, and a third signal input 24. In the preferred embodiment, regulator 20 is configured to include a first regulator 35 that forms the first output voltage on output 26 and a second regulator 36 that forms the second output voltage on output 27. Regulator 20 also usually includes a power-on reset circuit (POR) 28, a reference signal generator or reference 30, a programming and test block 40 that is utilized to receive data from external to regulator 20, a first feedback network 38 that receives some of the data from block 40 and provides a first feedback signal to regulator 35, and a second feedback network 39 that receives some of the data from block 40 and provides a second feedback signal to regulator 36. The first and second feedback signals are representative of the value of the respective first and second output voltages. The relationship between the value of each feedback signal and the value of the respective output voltage is selected by the value of the data received from block 40. POR 28 forms a reset signal on an output of POR 28 that is asserted until POR 28 detects that the voltage on input 21 has increased to a certain threshold value. In some embodiments, regulator 20 may include an internal operating voltage regulator (not shown) that receives the input voltage from input 21 and provides an internal operating voltage that is utilized for operating the elements of regulator 20 such as block 40. Reference 30 provides a reference signal that is used by regulators 35 and 36 to assist in regulating the value of the output voltage. In the preferred embodiment, regulators 35 and 36 are linear regulators. In this preferred embodiment, the data from block 40 is utilized to program the value of the first and second feedback signals from respective networks 38 and 39 in order to program the value of the first and second output voltages. As will be appreciated by those skilled in the art, the data from block 40 may be used for other functions in addition to or instead of programming the value of the feedback signals and the output voltages.

Figure 2:
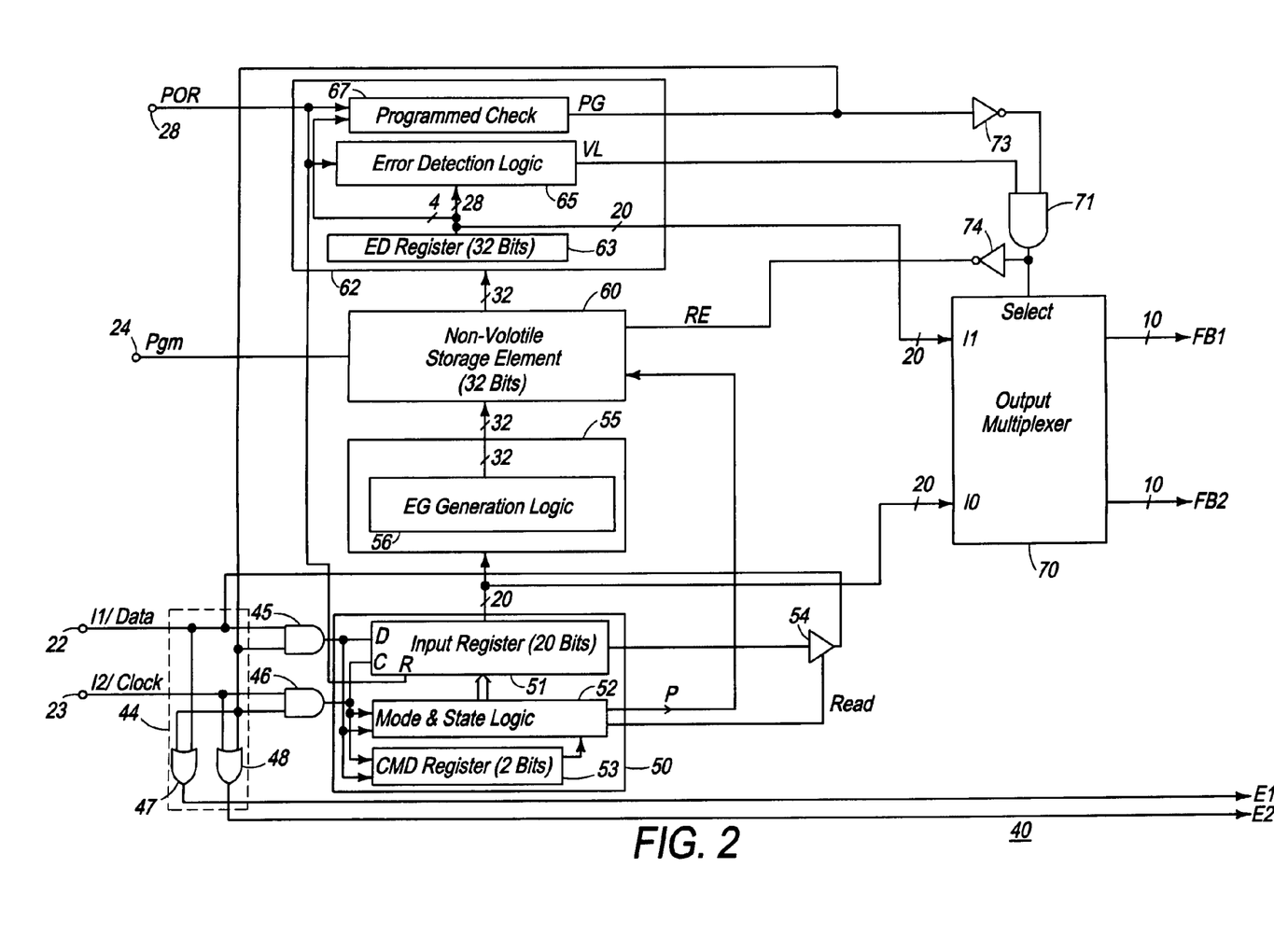
FIG. 2 schematically illustrates a block diagram of a portion of an embodiment of the programmable voltage regulator of FIG. 1 in accordance with the present invention.

FIG. 2 schematically illustrates a block diagram of an embodiment of a portion of block 40. The exemplary embodiment of block 40 includes an input block 50, an error check-bit generation block 55, a non-volatile storage element 60, an error detection circuit 62, an output multiplexer or Mux 70, control logic such as an AND gate 71, and an enable control circuit 44. Non-volatile storage element 60 may be any of a variety of non-volatile storage elements that are well known to those skilled in the art including a flash EPROM, an EEPROM, or other non-volatile device. Error detection circuit 62 includes an error detection (ED) register 63, error detection logic 65, and a programmed check block 67.

Regulator 20 is configured to operate in either a programming mode or a normal mode. In the normal mode, inputs 22 and 23 function as enable inputs that are used to enable and disable the operation of respective regulators 35 and 36 (FIG. 1). In the normal mode, input 24 is not used. In the programming mode, input 22 receives data from external to regulator 20. The data is information that is to be programmed into regulator 20 and used to control the value of the output voltages of regulators 35 and 36. Input 23 is used as a clock signal to clock the data on input 22 into regulator 20. Input 24 is used to apply a high voltage to element 60 in order to assist in programming or storing or writing information into element 60.

Figure 3:
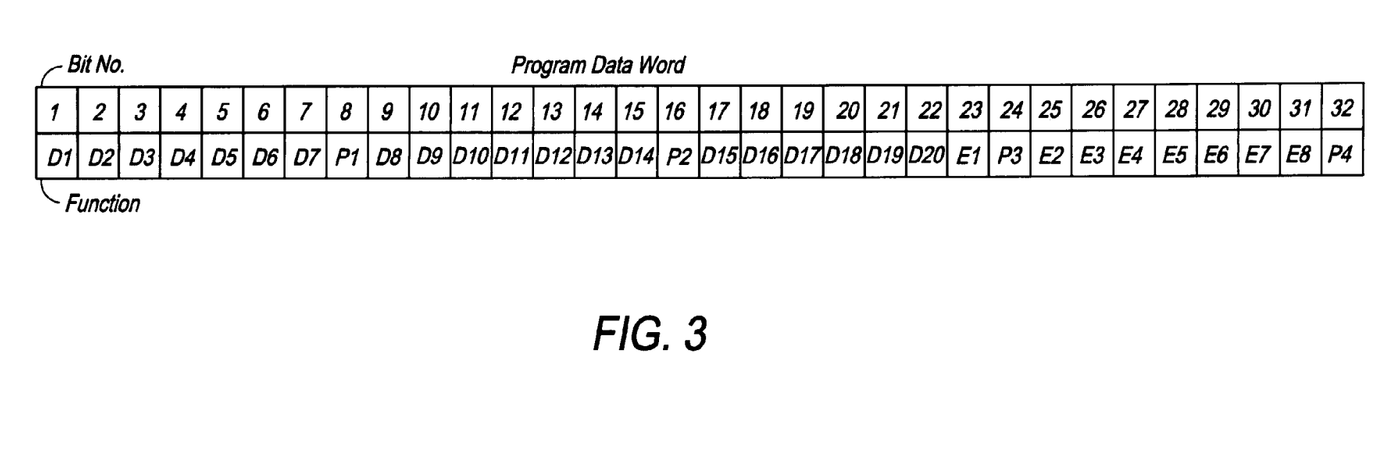
FIG. 3 illustrates an exemplary embodiment of some of the programming information for the programmable voltage regulator of FIG. 1 in accordance with the present invention.

FIG. 3 illustrates an exemplary embodiment of a program data word containing information, including the received data, that is stored or written into element 60. This description has references to FIG. 1 through FIG. 3. The data that is received by regulator 20 on input 22 is illustrated by the letter D followed by a number representing the bit number of the data, the error check-bits that are generated by block 55 are represented by the letter E followed by a number representing the bit number of the error check-bit. In addition to the data and the error check-bits, block 55 also generates four program bits represented by the letter P followed by a number. The program bits are used to indicate that the program data word was stored or written into non-volatile storage element 60.

In the preferred embodiment, the non-programmed state of element 60 is an all one state. Thus, a logic zero is stored into a bit by writing a zero into that bit and a logic one is stored by not writing the bit. For this reason, the preferred embodiment of program bits P1-P4 uses a one to represent the non-programmed state of element 60 and a zero to represent the program state. In this preferred embodiment, register 63 is configured to be initialized to an all one state every time power is applied to regulator 20. This configuration aids in controlling the mode of regulator 20. Upon power-up, the POR signal from POR 28 resets register 51 to all zero state. Those skilled in the art will appreciate that the POR signal could also be used to initialize register 63.

As power is first applied to regulator 20, the operating mode of regulator 20 is controlled by register 63. Because register 63 is configured to always power-up in an all ones state, the four program bits (P1-P4) are all one. Programmed check block 67 receives the ones from register 63 and forces the programmed (PG) signal high indicating that element 60 is not programmed. Also, logic 65 receives the all ones from register 63. The error detect algorithm of logic 65 provides a valid result for an all ones value of the data and error check-bits, thus, the valid (VL) signal is also high. The high PG signal, through inverter 73, and the high VL signal force the read (RE) signal from gate 71 and inverter 74 high. RE being high causes element 60 to perform a read operation and provide the stored value of the program data word from element 60 to error detection (ED) circuit 62. The program data word from element 60 is then stored into ED register 63. The stored values of program bits P1-P4 are received by block 67. Because element 60 is not programmed, the stored value of the program data word including program bits P1-P4 is all ones which keeps the PG, VL, and RE signals high. Thus, element 60 continues to perform a read operation and provides the stored value of the program data word to circuit 62 as long as program bits P1-P4 remain high. The high PG signal also enables gates 45 and 46 to allow the data received on input 22 and the clock received on input 23 to be received by input register 51 of input block 50. PG being high also forces the output of gates 47 and 48 and the corresponding E1 and E2 signals high. As will be seen further hereinafter, the high E1 and E2 signals will be used to test the data that is received onto register 51 before it is programmed into element 60. Since PG is high and enables gates 45 and 46, regulator 20 is set to operation in the programming mode.

In the programming mode, block 40 can be controlled to operate in one of three states, a write state that writes data into input block 50, a read state that reads data out of block 50 for verification, and a program (PGM) state that writes or stores the data and check-bits from block 55 into element 60. In order to select one of these three states, inputs 22 and 23 are set to specific conditions to indicate that a control word is to be shifted into block 50. A high-to-low transition on input 22 while input 23 is held high indicates the start of a command sequence. The next two bits clocked into block 50 are stored into a CMD register 53 and are used by logic 52 to set the state of block 40 and the action to be taken (read, write, or program).

Figure 4:
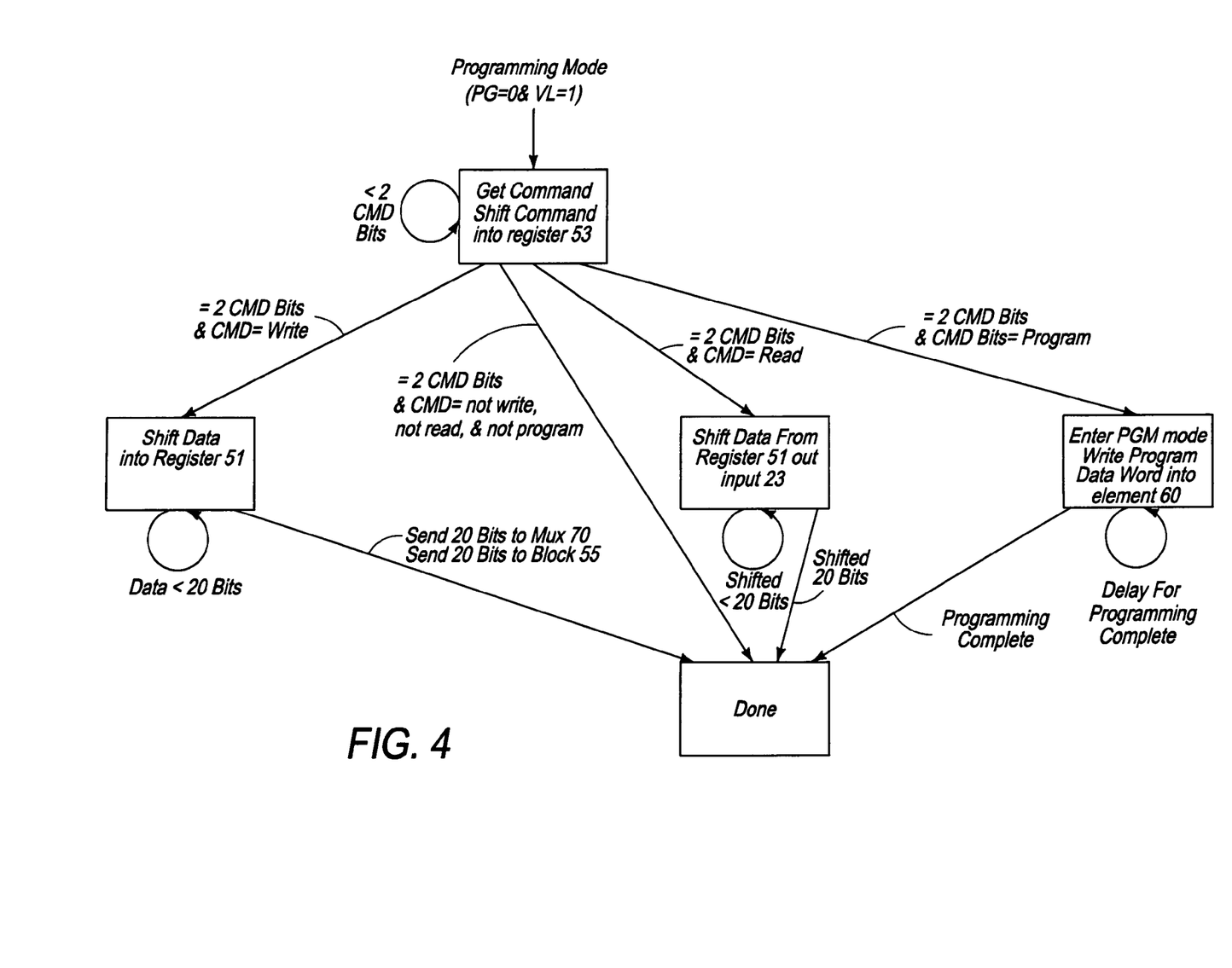
FIG. 4 is a state diagram illustrating an embodiment of a portion of some of the states for a portion of the programmable voltage regulator of FIG. 1 in accordance with the present invention.

Referring to FIG. 2 through FIG. 4, after regulator 20 is set into the programming mode by PG and VL being high, block 50 waits for inputs 22 and 23 to identify that a command sequence is being initiated. The next two bits are shifted into CMD register 53 to set block 40 to operate in the write, read, or program state. If CMD register 53 receives a write command, the clock signal on input 23 is utilized to clock the data on input 22 into register 51. In the preferred embodiment, twenty data bits are used where the first ten data bits are the data bits used to control the value of the output voltage on output 26 and the second ten bits are the data bits used to control the value of the output voltage on output 27. Logic 52 counts the data shifted into register 51 until twenty data bits are shifted into register 51. The data shifted into register 51 is received by block 55 and by MUX 70.

Error generation (EG) logic 56 receives the data from register 51 and generates check-bits E1-E8. In the preferred embodiment, error generation logic 56 is combinational logic that continually generates check bits E1-E8 responsively to the data received from register 51. Also in this preferred embodiment, logic 56 implements a Hamming code algorithm that implements the logic equations shown below in order to generate bits E1-E8:

$$E1 = D0 \oplus D1 \oplus D3 \oplus D4 \oplus D6 \oplus D8$$

$$E2 = D0 \oplus D2 \oplus D3 \oplus D5 \oplus D6 \oplus D9$$

$$E3 = D1 \oplus D2 \oplus D3 \oplus D7 \oplus D8 \oplus D9$$

$$E4 = D4 \oplus D5 \oplus D6 \oplus D7 \oplus D7 \oplus D9$$

$$E5 = D10 \oplus D11 \oplus D13 \oplus D14 \oplus D16 \oplus D19$$

$$E6 = D10 \oplus D12 \oplus D13 \oplus D15 \oplus D16 \oplus D19$$

$$E7 = D11 \oplus D12 \oplus D13 \oplus D17 \oplus D18 \oplus D19$$

$$E8 = D14 \oplus D15 \oplus D16 \oplus D17 \oplus D18 \oplus D19$$

where $\oplus$ =the logical exclusive or operator.

Any one of a variety of other error detection algorithms may be used instead of the algorithm that is implemented by the above equations. For example, other well-known Hamming codes may be used to provide the error detection algorithm or an error detection and correction algorithm may be used to correct in addition to detect errors. Logic 56 also sets the four program bits (P1-P4) of register 57 low so that the program data word may be written into element 60 with the program bits enabled or low.

The data from register 51 is also presented to an I0 input of MUX 70. Because the PG and VL signals are high, MUX 70 selects input I0 to outputs FB1 and FB2 so that the data from register 51 is applied to FB networks 38 and 39 (FIG. 1). The first ten bits of the data are routed to output FB1 and the second ten bits of the data are routed to FB2. Since signals E1 and E2 are high, regulators 35 and 36 are enabled to form the first and second output voltages on outputs 26 and 27 (FIG. 1). This allows regulator 20 to be tested to determine if the data that was just written into register 51 provides the desired value of the output voltages from regulator 20. If the output voltages are not correct, a new command sequence can be initiated and new data may be written into register 51 and re-tested. Once the new data is shifted into register 51, block 55 generates a new program data word as described hereinbefore. This procedure may be repeated until the proper data and output voltage values are obtained.

It is also possible to read the data stored in register 51. A command sequence may be initiated using inputs 22 and 23 as described hereinbefore to shift a read command into register 53. The read command is decoded by logic 52 which enables a driver 54 to drive input 22 with the serial output of register 51. Driver 54 generally is a tri-state driver that is in a tri-state condition until enabled by logic 52 after receiving the read command. Input 23 is used to clock register 51 and shift the data stored therein out through driver 54. In the preferred embodiment, logic 52 counts twenty clock pulses then terminates shifting register 51. The read state facilitates reading the data that is stored in register 51 and facilitates verifying the data.

Once a data word is obtained that provides the desired values of the first and second output voltages, a new command sequence may be initiated to program the information in the program data word into element 60. The state of block 40 may be changed to the programming mode by setting inputs 22 and 23 to identify a new command sequence and then shifting a control word in that corresponds to the program (PGM) state. Logic 52 decodes the program command and asserts the P control signal to initiate storing the data word, the error check-bits, and the program bits from logic 56 into element 60. The program signal on input 24 generally would also be asserted to apply the required voltage value for programming or storing information into element 60. During the programming state, the read cycles of element 60 are inhibited until the programming is complete. Because the read signal is still high, element 60 is once again read immediately after the programming of element 60 is complete. The program data word is read from element 60 and stored into register 63. The program data word now has program bits P1-P4 set low which forces the PG signal low. The remainder of the program data word (data bits D1-D20 and error check-bits E1-E8) are transferred to error detection logic 65. Error detection logic 65 checks the data bits and check-bits using the same algorithm that was used by logic 56 to generate the check-bits. If the results of the error detection algorithm are accurate, the valid (VL) signal goes high. Because PG is low and VL is high, gate 71 forces RE low so that element 60 is no longer read, and the previous program data word remains stored in register 63. The low state of PG forces MUX 70 to select input I1 to outputs FB1 and FB2 thereby selecting the twenty data bits (D1-D20) from register 63 to be used control regulators 35 and 36. Thus, the stored value of the data is used to control the value of the output voltages on outputs 26 and 27. The low PG signal also inhibits gates 45 and 46 thereby preventing the signals on inputs 22 and 23 from affecting block 40. The low PG signal also enables gates 47 and 48 to couple the signals on inputs 22 and 23 through gates 47 and 48 to respective signals E1 and E2 thereby allowing the signals on inputs 22 and 23 to enable and disable respective regulators 35 and 36. Thus, PG being low and VL being high sets regulator 20 to operate in the normal operating mode and use the data from element 60 to program the value of the first and second output voltages.

If power is removed from regulator 20 and subsequently re-applied, ED register 63 is again set to all ones which again forces PG and VL high which again places element 60 in a read operation. The POR signal resets register 51 to all zeros, and since RE is low MUX 70 selects the all zeros to networks 38 and 39 which sets regulators 35 and 36 to operate at the lowest voltage output values in order to protect loads 13 and 14. Also, the stored values of the program data word are read from element 60 and latched into register 63. The stored values force PG low and VL high to terminate the read operation and to operate regulator 20 in the normal mode using the program data retrieved from element 60.

If the value of any of the data or check bits in register 63 changes during the operation of regulator 20, the VL signal will be forced low which initiates a read cycle of element 60 thereby reloading register 63 with the program data word that was previously stored into element 60. If the retrieved data and check bits are verified to be correct by logic 65, VL again goes high and regulator 20 continues normal operation. If any one of programmed bits P1-P4 stored in register 63 go high, PG goes high which places element 60 into a read operation. In the preferred embodiment, element 60 is a one-time-programmable memory so that it can't be reprogrammed even if the control logic allows data to again be entered into input block 50. If the restored value of bits P1-P4 are all low, PG again goes low and regulator 20 continues normal operation. If the retrieved value of any one of bits P1-P4 is high, PG and RE again go high and element 60 is read continuously. However, register 51 would be set to all zeros by the reset signal from POR 28 so that MUX 70 selects all zeros to outputs FB1 and FB2 which forces regulators 35 and 36 to operate at the lowest output voltage possible.

Figure 5:
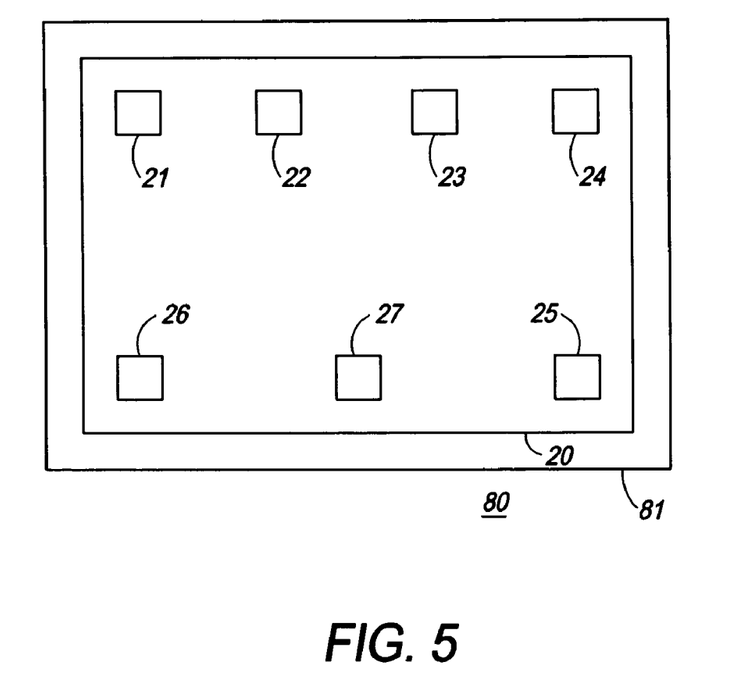
FIG. 5 schematically illustrates an enlarged plan view of a semiconductor device that includes the programmable voltage regulator of FIG. 1 in accordance with the present invention.

FIG. 5 schematically illustrates an enlarged plan view of a portion of an embodiment of a semiconductor device or integrated circuit 80 that is formed on a semiconductor die 81. Regulator 20 is formed on die 81. Die 81 may also include other circuits that are not shown in FIG. 5 for simplicity of the drawing. Regulator 20 and device or integrated circuit 80 are formed on die 81 by semiconductor manufacturing techniques that are well known to those skilled in the art.

Figure 6:
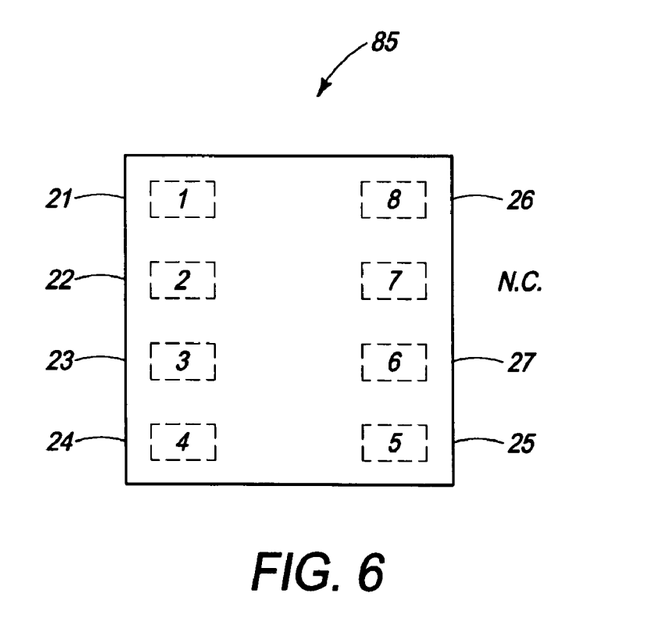
FIG. 6 illustrates an enlarged top plan view of an eight pin surface mount semiconductor package in accordance with the present invention.

FIG. 6 illustrates an enlarged top plan view of an eight pin surface mount semiconductor package 85. Package 85 has eight terminals, labeled as 1-8, that may be connected to a semiconductor die that is assembled into package 85. One suitable 8-pin package generally is referred to as an 8-pin DFN. Those skilled in the art will appreciate that other package types may also be used. In one embodiment, regulator 20 is formed on a semiconductor substrate as an integrated circuit having seven external leads or connections and is assembled into an eight pin semiconductor package such as package 85.

In view of all of the above, it is evident that a novel device and method is disclosed. Included, among other features, is using some of the inputs of the device to supply signals during a programming mode of operation and using some of those same inputs for other signals during another operating mode. Using the same two inputs for different functions during the two different operating modes reduces the pin count of the device and lowers the costs. Also included is configuring the device to verify the validity of a program word before using the stored program word to operate the device. Verifying the validity of the stored program word ensures that the device operates properly and does not damage other devices connected thereto.

While the subject matter of the invention is described with specific preferred embodiments, it is evident that many alternatives and variations will be apparent to those skilled in the semiconductor arts. For example, the sequence of writing data into regulator 20 and the sequence used to test the data before storing the data and the sequence of verifying the data may be different from the exact sequences explained in the descriptions of FIG. 1-FIG. 5 as long as the sequences generate check bits and verify the validity of the data and check bits before using the data to control the operation of regulator 20. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A voltage regulator comprising:
a non-volatile storage element configured to store data that controls an operation of the voltage regulator during a first operating mode of the voltage regulator, the non-volatile storage element configured to receive the data during a second operating mode of the voltage regulator;
a first input coupled to receive a first signal used to control the operation of the voltage regulator during the first operating mode and to receive the data from external to the voltage regulator during the second operating mode; and
a second input coupled to receive a second signal used to control the operation of the voltage regulator during the first operating mode and to receive a third control signal to store the data into the voltage regulator during the second operating mode.

2. The voltage regulator of claim 1 further including an error check generator that forms error check bits for the data.

3. The voltage regulator of claim 2 wherein the non-volatile storage element stores the data and the error check bits.

4. The voltage regulator of claim 1 further including an error detection circuit that receives the data stored in the non-volatile storage element and checks the data for errors.

5. The voltage regulator of claim 4 wherein the voltage regulator uses the data to set a first state of the voltage regulator if the data is valid and sets a second state of the voltage regulator if the data is not valid.

6. The voltage regulator of claim 4 wherein the voltage regulator uses the data to control a value of an output voltage formed by the voltage regulator responsively to a value of the data if the data is valid.

7. The voltage regulator of claim 6 wherein the voltage regulator sets the value of the output voltage to a minimum value if the data is not valid.

8. A method of forming a voltage regulator comprising:
configuring the voltage regulator to receive data from external to the voltage regulator;
configuring a error generation block to generate error check bits for the data;
configuring the voltage regulator to store the data and the error check bits;
configuring the voltage regulator to perform an error check of the data that was stored; and
configuring the voltage regulator to use the data to set a first operation state of the voltage regulator if the error check is valid and to set a second operation state of the voltage regulator if the error check is invalid.

9. The method of claim 8 wherein configuring the voltage regulator to use the data to set the first operation state includes configuring the voltage regulator to use the data to set a value of an output voltage controlled by the voltage regulator.

10. The method of claim 8 wherein configuring the voltage regulator to use the data to set the first operation state includes configuring the voltage regulator to use the data to set a value of a reference voltage responsively to a value of the data.

11. The method of claim 8 wherein configuring the voltage regulator to use the data to set the first operation state includes configuring the voltage regulator to continuously perform the error check of the data that was stored and use the data to set the first operation state of the voltage regulator responsively to a valid result of the error check.

12. The method of claim 10 wherein configuring the voltage regulator to perform the error check of the data includes configuring the voltage regulator to use both the data and the error check bits to perform the error check.

13. The method of claim 8 wherein configuring the voltage regulator to receive the data and configuring the voltage regulator to perform the error check includes configuring the voltage regulator to receive the data during a first operating mode of the voltage regulator and to perform the error check during a second operating mode of the voltage regulator.

14. The method of claim 13 wherein configuring the voltage regulator to receive the data during a first operating mode includes configuring a first input and a second input of the voltage regulator to receive respective first and second control signals during the first operating mode and to receive respective third and fourth control signals during the second operating mode.

15. The method of claim 14 wherein configuring the first input and the second input of the voltage regulator to receive respective first and second control signals includes configuring the first input and the second input to receive respective data and clock signals during the first operating mode wherein the data and clock signals are different from the third and fourth control signals.

16. The method of claim 14 further including configuring the voltage regulator to inhibit the first input and the second input from receiving the data and clock signals after the data and the error check bits are stored.

17. A method of operating a voltage regulator comprising:
receiving data from external to the voltage regulator;
generating error check bits for the data;
storing the data and the error check bits in a non-volatile storage element;
checking the data that was stored for errors; and
setting a first operation state of the voltage regulator if the error check is valid and setting a second operation state of the voltage regulator if the error check is invalid.

18. The method of claim 17 wherein setting a first operation state includes setting an output voltage responsively to a value of the data, wherein the output voltage is a voltage external to the voltage regulator and is controlled by the voltage regulator.

19. The method of claim 17 further including storing information indicating that the data is stored in the non-volatile storage element.

20. The method of claim 17 further including inhibiting the voltage regulator from receiving data from external to the voltage regulator responsively to information indicating that the data is stored.

* * * * *